US008044584B2

(12) United States Patent
Cho et al.

(10) Patent No.: US 8,044,584 B2
(45) Date of Patent: Oct. 25, 2011

(54) ORGANIC ELECTROLUMINESCENT DEVICE AND METHOD FOR MANUFACTURING THE SAME

(75) Inventors: Yoon-Hyeung Cho, Suwon-si (KR);
Jong-Hyuk Lee, Suwon-si (KR);
Hae-Seung Lee, Suwon-si (KR);
Won-Jong Kim, Suwon-si (KR);
Jin-Baek Choi, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 1094 days.

(21) Appl. No.: 11/267,185

(22) Filed: Nov. 7, 2005

(65) Prior Publication Data
US 2006/0097633 A1    May 11, 2006

(30) Foreign Application Priority Data

Nov. 8, 2004 (KR) .................. 10-2004-0090491
Nov. 8, 2004 (KR) .................. 10-2004-0090492

(51) Int. Cl.
*H05B 33/04* (2006.01)
*H01J 1/62* (2006.01)

(52) U.S. Cl. ........ 313/512; 313/503; 313/504; 313/505; 313/506

(58) Field of Classification Search .......... 313/495–512; 315/169.3, 169.4; 257/40, 79; 345/30, 36, 345/44, 45; 252/72, 181.1, 194
See application file for complete search history.

(56) References Cited

U.S. PATENT DOCUMENTS

| 3,775,631 | A  | * | 11/1973 | Morikawa ............ 313/502 |
| 5,454,892 | A  | * | 10/1995 | Kardon et al. ........... 156/67 |
| 5,990,373 | A  |   | 11/1999 | Klabunde |
| 6,226,890 | B1 |   | 5/2001  | Boroson et al. |
| 6,737,176 | B1 |   | 5/2004  | Otsuki et al. |
| 6,740,145 | B2 |   | 5/2004  | Boroson et al. |
| 2003/0127969 | A1 | * | 7/2003 | Aoki et al. ............. 313/503 |
| 2004/0191566 | A1 | * | 9/2004 | Kikuchi et al. .......... 428/690 |
| 2005/0046349 | A1 | * | 3/2005 | Tanaka et al. ........... 313/512 |

FOREIGN PATENT DOCUMENTS

| CN | 1477908 | 2/2004 |
| CN | 1536938 | 10/2004 |
| CN | 1575048 | 2/2005 |
| JP | 1997-9-148066 | 6/1997 |

(Continued)

OTHER PUBLICATIONS

Chinese Office Action dated Oct. 24, 2008.

(Continued)

*Primary Examiner* — Karabi Guharay
*Assistant Examiner* — Elmito Breval
(74) *Attorney, Agent, or Firm* — H.C. Park & Associates, PLC

(57) ABSTRACT

An organic electroluminescent device includes a substrate, an encapsulation substrate, an organic electroluminescent portion interposed between the substrate and the encapsulation substrate and a transparent moisture absorption layer. The transparent moisture absorption layer comprises at least one of a metal oxide and a metal salt with an average particle diameter of about 100 nm or less, a binder, and a dispersant. The transparent moisture absorption layer may be disposed in an internal space provided by the substrate and the encapsulation substrate and may be used in a front emission type organic electroluminescent device.

26 Claims, 8 Drawing Sheets

FOREIGN PATENT DOCUMENTS

| | | |
|---|---|---|
| JP | 2002-056970 | 2/2002 |
| JP | 2002-158088 | 5/2002 |
| JP | 2002-280166 | 9/2002 |
| JP | 2003-142256 | 5/2003 |
| JP | 2003-264061 | 9/2003 |
| JP | 2003-317934 | 11/2003 |
| JP | 2003-338366 | 11/2003 |
| JP | 2004-079208 | 3/2004 |
| JP | 2004-095233 | 3/2004 |
| JP | 2004-311345 | 11/2004 |
| JP | 2004311345 A * | 11/2004 |
| WO | 2005/100246 | 10/2005 |

OTHER PUBLICATIONS

Registration Determination Certificate of CN Patent Application No. 1832222 issued on Nov. 3, 2010, Corresponding to U.S. Appl. No. 11/267,185.

* cited by examiner

ORGANIC ELECTROLUMINESCENT DEVICE AND METHOD FOR MANUFACTURING THE SAME

CROSS REFERENCE TO RELATED APPLICATIONS

This application claims priority to and the benefit of Korean Patent Application Nos. 10-2004-0090491, filed on Nov. 8, 2004, and 10-2004-0090492, filed on Nov. 8, 2004, in the Korean Intellectual Property Office, the disclosures of which are incorporated herein in their entirety by reference.

BACKGROUND OF THE INVENTION

1. Field of the Invention

The present invention relates to an organic electroluminescent device comprising a transparent moisture absorption layer that can be used in a front emission type device and a method for manufacturing the organic electroluminescent device.

2. Description of the Background

Organic electroluminescent devices may easily deteriorate as a result of the permeation of moisture. Therefore, an encapsulation structure is required to ensure stable driving and an extended lifetime of an organic electroluminescent device.

Conventionally, a metal can or a glass substrate formed into a cap with a groove is used in an organic electroluminescent device. For moisture adsorption, a desiccant powder is mounted in the groove or a desiccant film is adhered to the groove with double-sided tape.

Japanese Laid-Open Patent Publication No. Hei 9-148066 discloses an organic electroluminescent device that includes a laminate having a pair of electrodes facing each other with an organic light-emitting material layer made of an organic compound interposed between the electrodes. The device also includes an airtight container for preventing exposure of the laminate to air and drying means made of, for example, alkali metal oxide, disposed in the airtight container. However, the bulky structure of the airtight container increases the total thickness of the organic electroluminescent device. Also, the opaqueness of the drying means renders the fabrication of a front emission type organic electroluminescent device difficult, even though the drying means is maintained in a solid state after absorbing moisture.

U.S. Pat. No. 6,226,890 describes an organic electroluminescent device that includes a moisture absorption layer produced using a desiccant and a binder. The moisture absorption layer contains solid particles with a particle size of 0.1-200 µm.

However, the organic electroluminescent device is translucent or opaque, and thus cannot be used as a front emission type device, and also has low moisture absorption ability.

SUMMARY OF THE INVENTION

The present invention provides an organic electroluminescent device comprising a transparent moisture absorption layer that has good moisture absorption ability and can be used in a front emission type device, and a method for manufacturing the organic electroluminescent device.

The present invention also provides a method for preparing a composition for forming a transparent moisture absorption layer that has good moisture absorption ability and can be used in a front emission type device, and an organic electroluminescent device comprising a transparent moisture absorption layer formed using the composition prepared using the method.

Additional features of the invention will be set forth in the description which follows, and in part will be apparent from the description, or may be learned by practice of the invention.

The present invention discloses an organic electroluminescent device, comprising a substrate, an encapsulation substrate, an organic electroluminescent portion interposed between the substrate and the encapsulation substrate, and a transparent moisture absorption layer. The transparent moisture absorption layer comprises at least one of a metal oxide and a metal salt with an average particle diameter of about 100 nm or less, a binder, and a dispersant. The transparent moisture absorption layer is disposed in an internal space provided by the substrate and the encapsulation substrate.

The present invention also discloses an organic electroluminescent device, comprising a substrate, an encapsulation substrate, an organic electroluminescent portion interposed between the substrate and the encapsulation substrate, and a transparent moisture absorption layer. The transparent moisture absorption layer comprises at least one of a metal oxide and a metal salt having a difference of 100 nm or less between a particle diameter under which 10% by weight of the particles are to be found (D10) and a particle diameter under which 90% by weight of the particles are to be found (D90) and disposed in an internal space provided by the substrate and the encapsulation substrate.

The present invention also discloses an organic electroluminescent device comprising a substrate, an encapsulation substrate, an organic electroluminescent portion interposed between the substrate and the encapsulation substrate, and a transparent moisture absorption layer that is disposed in an internal space provided by the substrate and the encapsulation substrate. The transparent moisture absorption layer comprises at least one of a metal oxide and a metal salt with an average particle diameter of about 100 nm or less and a binder. The transparent moisture absorption layer is about 100 µm to about 300 µm thick. The transparent moisture absorption layer has a transmittance of about 95% or greater.

The present invention also discloses a method for manufacturing an organic electroluminescent device comprising forming an organic electroluminescent portion comprising a first electrode, an organic layer, and a second electrode that are layered on a substrate, coating a composition for forming a transparent moisture absorption layer in an internal space provided by the substrate and an encapsulation substrate, curing the composition to obtain a transparent moisture absorption layer, coating a sealant at an outer region of the organic electroluminescent portion on at least one of the substrate and the encapsulation substrate, and coupling the substrate with the encapsulation substrate. The composition for forming a transparent moisture absorption layer comprises at least one of a metal oxide and a metal salt having an average particle diameter of 100 nm or less, a binder, a dispersant, and a solvent.

The present invention also discloses a method for manufacturing an organic electroluminescent device comprising forming an organic electroluminescent portion including a first electrode, an organic layer, and a second electrode sequentially layered on a substrate, coating a composition for forming a transparent moisture absorption layer in an internal space provided by the substrate and an encapsulation substrate and curing the composition to obtain a transparent moisture absorption layer, coating a sealant at an outer region of the organic electroluminescent portion on at least one of the substrate and the encapsulation substrate; and combining the substrate with the encapsulation substrate. The composition for forming a transparent moisture absorption layer comprises at least one of a metal oxide and a metal salt having a difference of about 100 nm or less between a particle diameter under which about 10% by weight of the particles are to be found (D10) and a particle diameter under which about 90% by weight of the particles are to be found (D90), and a solvent.

The present invention also discloses a method for preparing a composition for forming a transparent moisture absorption layer for an organic electroluminescent device comprising mixing at least one of a metal oxide and a metal salt with a solvent to obtain a dispersion and milling the dispersion.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1A:
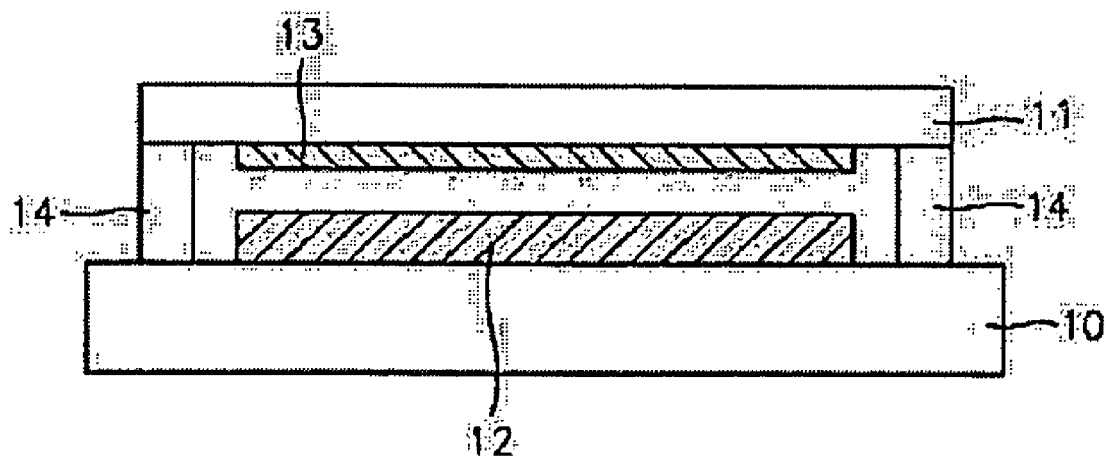
FIG. 1A, FIG. 1B, FIG. 1C, and FIG. 1D are schematic cross-sectional views of organic electroluminescent devices according to exemplary embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity.

It will be understood that when an element such as a layer, film, region or substrate is referred to as being "on" another element, it can be directly on the other element or intervening elements may also be present. In contrast, when an element is referred to as being "directly on" another element, there are no intervening elements present.

The invention provides an organic electroluminescent device with a long lifespan that may be fabricated using a transparent moisture absorption layer that has excellent moisture and oxygen absorption properties and high transparency relative to a conventional getter. In the organic electroluminescent device, an etched glass substrate or a flat glass that is not etched may be used as a front substrate. Thus, a structural weakness due to the use of etched glass substrate can be overcome.

Further, since a composition for forming a transparent moisture absorption layer prepared according to the present invention includes nano-sized metal oxide particles such as calcium oxide particles that are uniformly dispersed therein in a high concentration, scattering does not occur in the moisture absorption layer formed using the composition. Thus, the moisture absorption layer is transparent. The transparent moisture absorption layer may be used in a front emission type organic electroluminescent device.

An organic electroluminescent device according to an embodiment of the present invention comprises a transparent moisture absorption layer that is suitable for a front emission type device. The transparent moisture absorption layer is formed by coating and curing a composition for forming a transparent moisture absorption layer. The composition comprises a metal oxide and/or a metal salt that has an average particle diameter of 100 nm or less, a binder, a dispersant, and a solvent. The metal oxide reacts with water to break a metal-oxygen-metal bond and form a metal hydroxide, resulting in the removal of water. In the case of the metal salt, a water molecule coordinates with the empty binding site of the center metal to form a stable compound, and thus, water is removed.

The metal oxide and the metal salt may include an alkali metal oxide, an alkali earth metal oxide, a metal halide, a metal sulfate, a metal perchlorate, or a phosphorouspentoxide ($P_2O_5$), for example.

The alkali metal oxide may include lithium oxide ($Li_2O$), sodium oxide ($Na_2O$), or potassium oxide ($K_2O$), for example. The alkali earth metal oxide may include barium oxide (BaO), calcium oxide (CaO), or magnesium oxide (MgO), for example. The metal sulfate may include lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$), or nickel sulfate ($NiSO_4$), for example. The metal halide may include calcium chloride ($CaCl_2$), magnesium chloride ($MgCl_2$), strontium chloride ($SrCl_2$), yttrium chloride ($YCl_2$), copper chloride ($CuCl_2$), cesium fluoride (CsF), tantalum fluoride ($TaF_5$), niobium fluoride ($NbF_5$), lithium bromide (LiBr), calcium bromide ($CaBr_3$), cerium bromide ($CeBr_4$), selenium bromide ($SeBr_2$), vanadium bromide ($VBr_2$), magnesium bromide ($MgBr_2$), barium iodide ($BaI_2$), or magnesium iodide ($MgI_2$), for example. The metal perchlorate may include barium perchlorate ($Ba(ClO_4)_2$) or magnesium perchlorate ($Mg(ClO_4)_2$), for example.

In an embodiment of the present invention, the metal oxide or the metal salt is finely pulverized using physical and chemical methods to have an average particle diameter of about 100 nm or less.

The metal oxide or metal salt particles may have an average particle diameter of about 100 nm or less, particularly about 50 nm to about 90 μm. If the average particle diameter of the metal oxide or metal salt particles is greater than 100 nm, scattering may occur in the visible light range in a moisture absorption layer formed using the particles, resulting in haze (a phenomenon where the layer appears cloudy) and reducing transmittance.

The binder may be an organic binder, an inorganic binder, an organic/inorganic complex binder, or a mixture thereof. The organic binder may have a low molecular weight or a high molecular weight. The organic binder should be compatible with the metal oxide or metal salt particles and have an excellent ability to form a layer. The organic binder may include, but is not limited to an acrylic resin, a methacrylic resin, polyisoprene, a vinyl resin, an epoxy resin, a urethane resin, and a cellulose resin. Examples of the acrylic resin may include butyl acrylate, ethylhexyl acrylate, etc. Examples of the methacrylic resin may include propylene glycol methacrylate, tetrahydrofurfuryl methacrylate, etc. Examples of the vinyl resin may include vinyl acetate, N-vinylpyrrolidone, etc. Examples of the epoxy resin may include cycloaliphatic epoxide, etc. Examples of the urethane resin may include urethane acrylate, etc. Examples of the cellulose resin may include cellulose nitrate, etc.

The inorganic binder may be a metal or a non-metal, such as silicon, aluminum, titanium, or zirconium. The inorganic binder may be compatible with the metal oxide or metal salt particles and have an excellent ability to form a layer. The inorganic binder may include, but is not limited to titania, silicon oxides, zirconia, alumina, and precursors thereof.

The organic/inorganic complex binder may include an organic material that is bound to a metal or a non-metal such as silicon, aluminum, titanium, or zirconium via a covalent bond. The organic/inorganic complex binder should be compatible with the metal oxide or metal salt particles and have an excellent ability to form a layer. The organic/inorganic complex binder may include, but is not limited to epoxy silane or its derivative, vinyl silane or its derivative, amine silane or its derivative, methacrylate silane or its derivative, and a partially cured product thereof. The partially cured product is used to control the physical properties of the composition such as viscosity, for example.

Specific examples of the epoxy silane or its derivative may include 3-glycidoxypropyltrimethoxysilane and its polymer.

The vinyl silane or its derivative may include vinyltriethoxysilane and its polymer, for example.

Specific examples of the amine silane or its derivative may include 3-aminopropyltriethoxysilane and its polymer, for example.

The methacrylate silane or its derivative may include 3-(trimethoxysilyl)propyl acrylate and its polymer, for example.

The binder used in the present invention may also have excellent thixotropy, which allows for printing and excellent leveling properties.

The concentration of the binder may be about 10 wt % to about 5000 wt % based on the weight of metal oxide and the metal salt. If the concentration of the binder is less than 10 wt %, a transparent moisture absorption layer cannot be easily formed. If the concentration of the binder is greater than 5000 wt %, the moisture absorption ability decreases.

The dispersant used in an embodiment of the present invention may increase dispersibility in a desiccant dispersion when it is mixed with the binder. The dispersant may include a high molecular weight organic dispersant, a high molecular weight organic/inorganic complex dispersant, an organic acid, and an inorganic acid, but is not limited thereto.

The dispersant may include at least one organic compound including, but not limited to an acrylic resin, a methacrylic resin, a urethane resin, polyisoprene, a vinyl resin, an epoxy resin, an amide resin, a sulfone resin, a phthalate resin, a phenoxide resin, and a cellulose resin. The dispersant may further comprise at least one metal alkoxide compound including, but not limited to silicon alkoxide, titanium alkoxide, aluminum alkoxide, an organic/inorganic complex silicon alkoxide polymer, an organic/inorganic complex titanium polymer, and an organic/inorganic complex aluminum alkoxide polymer. In addition, the dispersant may include acetyl acetone and/or an organic acid, such as acetic acid, for example.

Specific examples of the acrylic resin may include polyacrylate. Specific examples of the methacrylic resin may include polymethacrylate. Specific examples of the cellulose resin may include cellulose acetate. The organic compounds may have a weight average molecular weight of 8000-15000.

Examples of the silicon alkoxide may include ethyl silicate. Examples of the titanium alkoxide may include titanium isopropoxide. Examples of the aluminum alkoxide may include aluminum butoxide. Examples of the organic/inorganic complex silicon alkoxide polymer may include epoxy propyl silicate. Examples of the organic/inorganic complex titanium polymer may include titanium polymer (for example, titanium 2-ethylhexoxide). Examples of the organic/inorganic complex aluminum alkoxide polymer may include aluminum acetylacetonate.

When a dispersant is used, the metal oxide particles, such as CaO, in the transparent moisture absorption layer may have a diameter on the order of nm. If the dispersant is not used, the metal oxide particles may aggregate during the process, and thus, cannot exist on the order of nm in the final transparent moisture absorption layer, even though the metal oxide particles initially have a particle size on the order of nm.

To disperse the fine particles in the solution without aggregation and precipitation, two methods may be used. In the first method, surfaces of the particles are positively or negatively charged and are prevented from aggregating due to electrostatic repulsive forces between the charged particles. This allows the particles to be dispersed easily in the solution and retains the electrical properties of the particles. However, the electrical repulsive forces may be greatly affected by the pH of the solution, and thus, the dispersibility may be lowered easily.

In the second method, the particles are surrounded by high molecular weight dispersants that prevent aggregation due to the steric hindrance between them. In this method, a wide range of solvents may be used regardless of their polarity to provide high dispersion stability. However, particles that have electrical properties may not be used in this method and the dispersant that may be used is expensive. The dispersant of the desiccant dispersion used in an embodiment of the present invention has a high molecular weight, and thus, when the dispersant is mixed with the binder, the dispersibility can be maintained and the solution can be uniformly mixed.

The concentration of the dispersant in the composition for forming the transparent moisture absorption layer may be about 1 wt % to about 100 wt % based on the weight of the metal oxide and the metal salt. If the concentration of the dispersant is less than 1 wt %, the metal oxide may not be uniformly dispersed in the composition. If the concentration of the dispersant is greater than 100 wt %, the relative concentration of the metal oxide in the composition is disadvantageously decreased.

The solvent may also include a polar solvent and a non-polar solvent.

Examples of the polar solvent may include but are not limited to alcohols, ketones, etc. Examples of the non-polar solvent may include aromatic hydrocarbon-based, alicyclic hydrocarbon-based, and aliphatic hydrocarbon-based organic solvents. The solvent may include at least one of ethanol, methanol, propanol, butanol, isopropanol, methyl ethyl ketone, propylene glycol, (mono)methyl ether (PGM), isopropyl cellulose (IPC), methylene carbonate, ethylene carbonate, methyl cellosolve (MC), and ethyl cellosolve (EC).

The concentration of the solvent in the composition may be about 400 wt % to about 1900 wt % based on the weight of the metal oxide and the metal salt. If the concentration of the solvent is less than about 400 wt %, the effect of adding the solvent is too weak. If the concentration of the solvent is greater than 1900 wt %, the relative concentration of the metal oxide in the composition is disadvantageously decreased.

The transparent moisture absorption layer may be formed thick by using the above-mentioned binder and dispersant. The amount of moisture absorbed may be increased by increasing the concentration of nano-sized desiccant that is impregnated in the layer. By selecting a suitable type of the binder, even a layer with a thickness of 100 μm or greater may be highly transparent. The viscosity of the composition for forming the transparent moisture absorption layer may also be controlled by using the binder. The transparent moisture absorption layer may be formed using a printing process.

The organic electroluminescent device of the present invention may include a transparent moisture absorption layer that is disposed in an internal space provided by a substrate and an encapsulation substrate. In particular, the transparent moisture absorption layer may be formed on an inner surface of the encapsulation substrate illustrated in FIG. 1A and FIG. 1D, formed on a sidewall of a sealant layer as illustrated in FIG. 1B, or formed on a portion of at least one of the substrate and the encapsulation substrate (for example, in a groove portion of the substrate as illustrated in FIG. 1C).

The organic electroluminescent device comprises the transparent moisture absorption layer, which can be used in a front emission type device. The transparent moisture absorption layer comprises at least one of a metal oxide and a metal salt. The difference between a particle diameter under which 10% by weight of the particles are to be found (D10) is about 20 to 40 nm and a particle diameter under which 90% by weight of the particles are to be found (D90) is about 120 to 140 nm. The transmittance of the organic electroluminescence devices may be measured by using light analyzer (such as one provided by PSI Co.) in a visible wavelength of 380-780 nm. The haze of the organic electroluminescence devices may be measured by using a Haze meter NDH 2000 (Nippon Denshoku), and D90 and D10 may be measured by particle size measurements of Zeta master (Malvern Co.). If the difference between D10 and D90 is greater than 100 nm, the transmittance decreases and the haze increases.

The metal oxide and the metal salt may have an average particle diameter of about 100 nm or less, particularly about 50 nm to about 90 nm. The metal oxide and the metal salt may have a minimum particle diameter ($D_{min}$) of about 30 nm or greater, particularly about 35 nm to about 45 nm, and a maximum particle diameter ($D_{max}$) of about 120 nm or less, particularly about 90 nm to about 100 nm. If the minimum particle diameter ($D_{min}$) is less than about 30 nm, the composition for the transparent absorption layer may become more thixotropic and the viscosity may increase. If the maximum particle diameter ($D_{max}$) is greater than about 120 nm, the transmittance decreases and the haze increases.

A method for preparing a composition for forming a transparent moisture absorption layer that can be used in a front emission type organic electroluminescent device according to an exemplary embodiment of the present invention will now be described.

The transparent moisture absorption layer may absorb moisture and oxygen that penetrate into the layer and have a high transmittance. Thus, nano-sized metal oxide particles, such as, CaO particles, should be stably dispersed in the composition for forming the transparent moisture absorption layer, such that light emitted is not scattered. Also, since the metal oxide mixed with various additives such as the organic binder or the inorganic binder, the particles should be stably dispersed in the composition and the solid concentration of the composition should be high.

A composition in which the nano-sized metal oxide or metal salt is dispersed uniformly is prepared according to the following process.

First, metal oxide or metal salt particles are mixed with a solvent to obtain a dispersion. Inorganic beads such as zirconia beads may also be added to the dispersion. In this case, the size of the metal oxide or the metal salt may be efficiently reduced and the risk of contamination may be reduced. The beads may have a particle diameter of about 1 mm or less, particularly about 0.1 mm to about 0.5 mm, but the particle diameter of the beads is not limited thereto. The beads are subsequently removed after a milling process.

A dispersant may be further added to the dispersion to increase the dispersion efficiency of the metal oxide or the metal salt in the composition.

Next, the dispersion is milled to form the composition. The milling method is not specifically limited, but the milling may be performed using an apparatus such as a paint shaker, a Dyno® mill, or an Apex® mill, for example. The milling may be performed for about 1-60 hours, particularly about 4-30 hours, but the milling time is not limited thereto.

A binder, as described above, may be further added to the composition after the milling.

The average particle diameter of the metal oxide particles in the composition obtained according to the above process is about 20 nm to about 300 nm, and may be about 60 nm to about 80 nm. The solid concentration of the composition may be about 5 wt % to about 30 wt % based on the weight of the composition. If the average particle diameter of the metal oxide particles is greater than about 300 nm, scattering occurs in the visible light range in the moisture absorption layer, thereby inducing haze and reducing the transmittance. If the solid concentration of the composition is less than about 5 wt % parts by weight, the concentration of the desiccant in the final solution is decreased. If the solid concentration of the composition is greater than 30 wt %, the dispersion stability of the desiccant in the final solution decreases.

A method for manufacturing an organic electroluminescent device including a transparent moisture absorption layer produced using the composition obtained by the above process according to an exemplary embodiment of the present invention will now be described in detail.

First, an organic electroluminescent portion comprising a first electrode, an organic layer, and a second electrode is formed on a substrate. Then, metal oxide or metal salt particles are mixed with a solvent and a dispersant to obtain a composition for forming a transparent moisture absorption layer.

The composition is coated on an inner surface of an encapsulation substrate and dried. The composition may be coated by dip coating, spin coating, spray coating, dispensing, or screen printing.

Then the dried composition is cured on the encapsulation substrate to obtain the transparent moisture absorption layer. Curing methods include thermal curing or UV curing. The thermal curing may be performed at about 100° C. to about 250° C. If the temperature of the thermal curing is greater than about 250° C., the binder may decompose and outgasing can occur. In addition, more time is required for cooling after the thermal curing. If the temperature of the thermal curing is less than about 100° C., the solvent may remain in the moisture absorption layer and the binder does not cure.

The transparent moisture absorption layer formed using the above method may be about 0.1 μm to about 12 μm. The transparent moisture absorption layer has good moisture and oxygen absorption properties and the organic electroluminescent device that includes the transparent moisture absorption layer is well sealed.

After preparing the encapsulation substrate with the transparent moisture absorption layer formed thereon, a sealant is coated on an outer portion of an organic electroluminescent portion on at least one of the substrate and the encapsulation substrate using a screen printer or a dispenser. Then, the substrate is combined with the encapsulation substrate to form the organic electroluminescent device.

The internal space of the organic electroluminescent device prepared using the above process may be placed under vacuum or filled with an inert gas. After combining the substrate with the encapsulation substrate, the sealant may be cured using UV light, visible light, or heat.

The transparent moisture absorption layer formed using the above method remains transparent before and after it absorbs moisture.

In the organic electroluminescent device, the transparent moisture absorption layer may be disposed in an internal space provided between a substrate and an encapsulation substrate. In particular, the transparent moisture absorption layer may be formed on an inner surface of the encapsulation substrate illustrated in FIG. 1A, on a sidewall of a sealant layer illustrated in FIG. 1B, or on a portion of at least one of the substrate and the encapsulation substrate (for example, in a groove portion of the substrate illustrated in FIG. 1C).

Figure 1B:
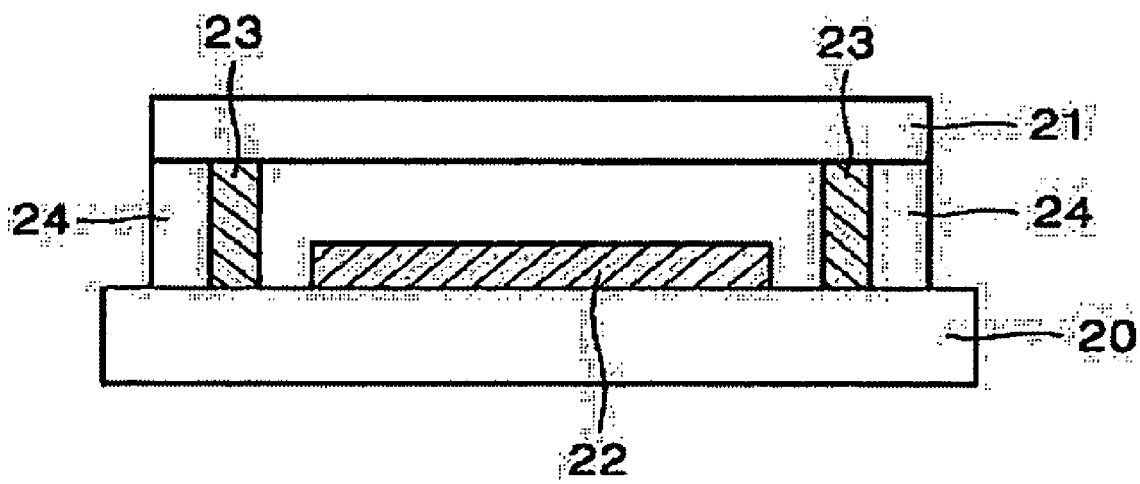
Figure 1C:
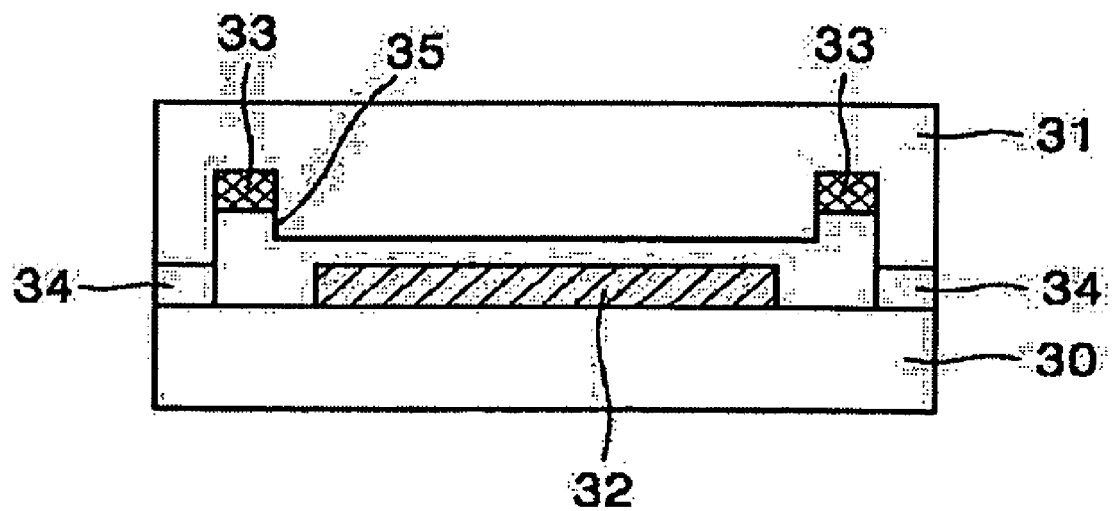

FIG. 1A is a schematic cross-sectional view of an organic electroluminescent devices according an exemplary embodiment of the present invention.

Referring to FIG. 1A, the organic electroluminescent device comprises a substrate 10 formed of glass or a transparent insulating material, an organic electroluminescent portion 12 that is disposed on a surface of the substrate 10 and includes a first electrode, an organic layer, and a second electrode that are sequentially layered. The device further comprises an encapsulation substrate 11 combined with the substrate 10 to form an internal space in which the organic electroluminescent portion 12 is housed. The internal space is sealed from the outside and a transparent moisture absorption layer 13 is formed on an inner surface of the encapsulation substrate 11. The transparent moisture absorption layer 13 comprises nano-sized porous oxide particles and has nano-sized pores.

The substrate 10 is combined with the encapsulation substrate 11 using a sealant layer 14 that is coated on an outer portion of the organic electroluminescent portion 12. The encapsulation substrate 11 may have a shape such as that illustrated in FIG. 1B.

Referring to FIG. 1B, an organic electroluminescent device to according to another exemplary embodiment of the present invention comprises a substrate 20 formed of glass or a transparent insulating material, an organic electroluminescent portion 22 that is disposed on a surface of the substrate 20 and includes a first electrode, an organic layer, and a second electrode that are sequentially layered. The device further comprises an encapsulation substrate 21 combined with the substrate 20 to form an internal space in which the organic electroluminescent portion 22 is housed. The internal space is sealed from the outside and a transparent nano-porous oxide layer 23 is disposed on sidewalls of a sealant layer 24.

Referring to FIG. 1C, an organic electroluminescent device according to another exemplary embodiment of the present invention comprises a substrate 30, an encapsulation substrate 31 having a groove portion 35 on its surface, and a transparent moisture absorption layer 33 that is disposed in the groove portion 35. An internal space provided by the substrate 30 and the encapsulation substrate 31 is sealed from the outside by the sealant layer 34.

Figure 1D:
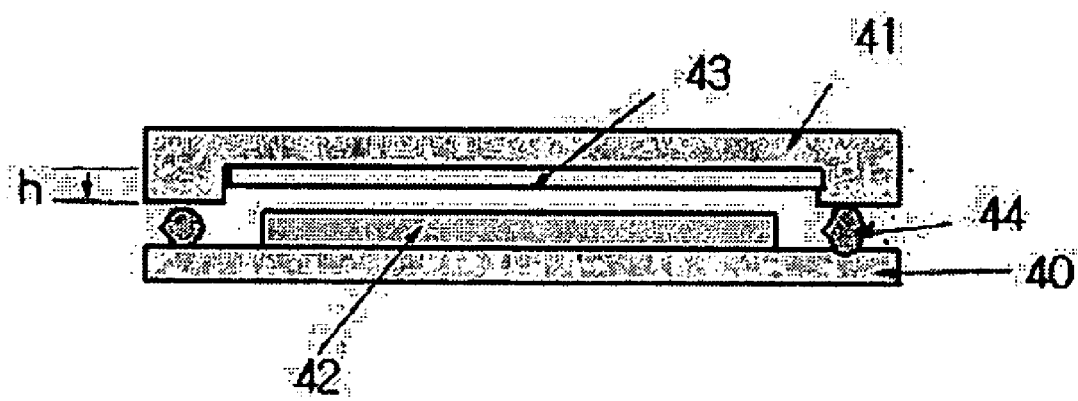

Referring to FIG. 1D, an organic electroluminescent device according to another embodiment of the present invention comprises an encapsulation substrate 41, which is an etched glass substrate, and a transparent moisture absorption layer 43 disposed in an etched portion of the etched glass substrate. An etching depth (h) of the etched glass substrate may be about 100 μm to about 300 μm, but is not limited thereto. The transparent moisture absorption layer 43 may be about 0.1 μm to about 300 μm thick. An organic electroluminescent portion 42 is disposed below the transparent moisture absorption layer 43 on a substrate 40.

The transparent moisture absorption layers 13, 23, 33, and 43 may be thick transparent nano CaO layers.

The organic electroluminescent portions 12, 22, 32, and 42 may be formed by deposition and each comprises a first electrode, an organic layer, and a second electrode. The first electrode may be a cathode and the second electrode may be an anode. The organic layer may comprise a hole injection layer, a hole transport layer, a light emitting layer, an electron injection layer, and/or an electron transport layer.

The encapsulation substrates 11, 21, 31, and 41 may comprise an insulating material, such as glass or a transparent plastic. A protective layer may be formed on an inner surface of the encapsulation substrate to provide protection against moisture. The protective layer may be resistant to heat, chemicals, and humidity. The encapsulation substrates 11, 21, 31, and 41 may be used in a front emission type device.

When used in a rear emission type device, the first electrode may be a transparent electrode and the second electrode may be a reflective electrode. On the other hand, when used in a front emission type device, the first electrode may be a reflective electrode and the second electrode may be a transparent electrode. The first electrodes are positioned near the encapsulation substrates 11, 21, 31, and 41 and the second electrodes are positioned near the substrates 10, 20, 30, and 40.

A protective layer may also be formed on an upper surface of the second electrode to allow for planarization of the organic electroluminescent portions 12, 22, 32, and 42 and to provide resistance to heat, chemicals, and humidity. The protective layer may comprise an inorganic material such as a metal oxide or a metal nitride.

The inner spaces defined by the encapsulation substrates 11, 21, 31, and 41 and the respective substrates 10, 20, 30, and 40 are maintained under vacuum or filled with an inert gas.

The transparent moisture absorption layers 13, 23, 33, and 43 may be as thick as possible, as long as sufficient transmittance is obtained. For example, the transparent moisture absorption layers 13, 23, 33, and 43 may be about 0.1 μm to about 300 μm thick. If it is thinner than 0.1 μm, the moisture absorption decreases. If it is thicker than 300 μm, the transparent moisture absorption layers 13, 23, 33, and 43 contact the cathode electrode causing an increase in the area where moisture may permeate.

When the encapsulation substrate 41 is the etched glass substrate illustrated in FIG. 1D, the transparent moisture absorption layer 43 may be about 0.1 μm to about 300 μM thick. If the transparent moisture absorption layer 43 is less than 0.1 μm thick, the moisture absorption decreases. If the transparent moisture absorption layer 43 is greater than 300 μm thick, it is greater than the etching depth (h) of the etched glass substrate and thus, the transparent moisture absorption layer 43 contacts the cathode electrode.

When the encapsulation substrate is a flat glass substrate, the transparent moisture absorption layers 13, 23, and 33 may be about 0.1 μm to about 70 μm.

The transparent moisture absorption layers 13, 23, 33, and 43 may include, but are not limited to an alkali metal oxide, an alkali earth metal oxide, a metal halide, a metal sulfate, a metal perchlorate, and a phosphorouspentoxide ($P_2O_5$), as described above. The average particle diameter of the particle may be about 100 nm or less, particularly about 20 to about 100 nm.

A method for manufacturing an organic electroluminescent device including a transparent moisture absorption layer according to another exemplary embodiment of the present invention will now be described in detail.

First, an organic electroluminescent portion comprising a first electrode, an organic layer, and a second electrode sequentially layered is formed on a substrate. Then, metal oxide particles, metal salt particles, or metal oxide particles and metal salt particles are mixed with a solvent, a dispersant, and a binder to obtain a composition for forming a transparent moisture absorption layer.

The composition for forming the transparent moisture absorption layer may be prepared according to the following process.

First, at least one of the metal oxide and the metal salt, which are desiccants, is mixed with the solvent and the dispersant. Then, the mixture is milled to obtain a dispersion comprising a nano-sized desiccant. Then, the dispersion is mixed with the binder to prepare the composition for forming the transparent moisture absorption layer. The compositions and concentrations of the constituents of the composition may be the same as those described above.

The solid concentration in the composition for forming the transparent moisture absorption layer may be about 2 wt % to about 25 wt %. If the solid concentration in the composition is less than about 2% by weight, the moisture absorption ability of the transparent moisture absorption layer decreases. If the solid concentration in the composition is more than 25% by weight, the transmittance decreases and the haze increases.

After preparing the composition for forming the transparent moisture absorption layer, the composition is coated on an inner surface of an encapsulation substrate and dried. The composition may be coated by dip coating, spin coating, spray coating, dispensing, or screen printing, but is not limited thereto.

When the transparent moisture absorption layer is formed using screen printing, the binder and the solvent in the composition function as vehicles for maintaining flowability of the composition to be printed. The composition for printing may have a viscosity of about 500 cps to about 20,000 cps. If the viscosity of the composition is not in the mentioned range, the quality of the printing may decrease.

Then, the dried composition on the encapsulation substrate is cured to obtain the transparent moisture absorption layer. Curing methods may include thermal curing or UV curing, for example. The thermal curing may be performed at about 100° C. to about 250° C. If the thermal curing temperature is more than about 250° C., the specific surface area of the particles decreases due to pre-sintering of the particles, thereby decreasing moisture absorption, and the binder decomposes due to the heat. If the thermal curing temperature is less than about 100° C., the solvent remains in the transparent moisture absorption layer or the transparent moisture absorption layer is not cured, and thus, the device may be damaged after encapsulation.

The transparent moisture absorption layer may be about 0.1 μm to about 300 μm thick and is able to absorb moisture and oxygen.

The transparent moisture absorption layer has a transmittance of about 95% to about 98% and absorbs about 30% to about 50% of the moisture.

When the transparent moisture absorption layer is about 100 μm to about 300 μm thick, it has a transmittance of about 95% or greater, typically about 96-98%, it absorbs 30-40% of moisture, and has a haze of 1.0 or less, typically 0.2-0.8. The transparent moisture absorption layer formed using the method is transparent before and after it absorbs moisture.

After preparing the encapsulation substrate having the transparent moisture absorption layer formed thereon, a sealant is coated on at least one of the substrate and the encapsulation substrate in an outer portion of the organic electroluminescent portion using a screen printer or a dispenser. Then, the substrate is combined with the encapsulation substrate to form the organic electroluminescent device.

Further, the internal space in the organic electroluminescent device manufactured using the above process may be placed under vacuum or filled with an inert gas. After the substrate and the encapsulation substrate are combined, the sealant may be cured using UV light, visible light, or heat.

The organic electroluminescent device according to an embodiment of the present invention may be a front emission type, a rear emission type, or a dual emission type device.

There are no particular limitations on a driving method for organic electroluminescent devices according to embodiments of the present invention. Both passive matrix (PM) driving and active matrix (AM) driving may be used.

Hereinafter, the present invention will be described in more detail with reference to the following examples. However, these examples are given for the purpose of illustration and are not intended to limit the scope of the invention.

EXAMPLE 1

100 parts by weight of anhydrous calcium oxide (CaO) (average particle diameter of 30 μm) and 10 parts by weight of an organic/inorganic complex siloxane, epoxycyclohexyltrimethoxysilane as a dispersant were mixed with 400 parts by weight of anhydrous ethanol. Then, the resulting mixture was milled for 24 hours to obtain a dispersion of particles with an average diameter of about 70 nm. The dispersion was mixed with 3000 parts by weight of urethane acrylate as an organic binder to obtain a composition for forming a transparent moisture absorption layer.

The composition was printed on an etched soda glass substrate and then thermally treated at 100° C. and UV cured to form a transparent moisture absorption layer.

An epoxy resin, as a sealant, was coated on at least a portion of the soda glass substrate with the transparent moisture absorption layer formed thereon and at least a portion of a glass substrate with a first electrode, an organic layer, and a second electrode formed thereon. Then, the two substrates were combined to form an organic electroluminescent device.

Figure 2A:
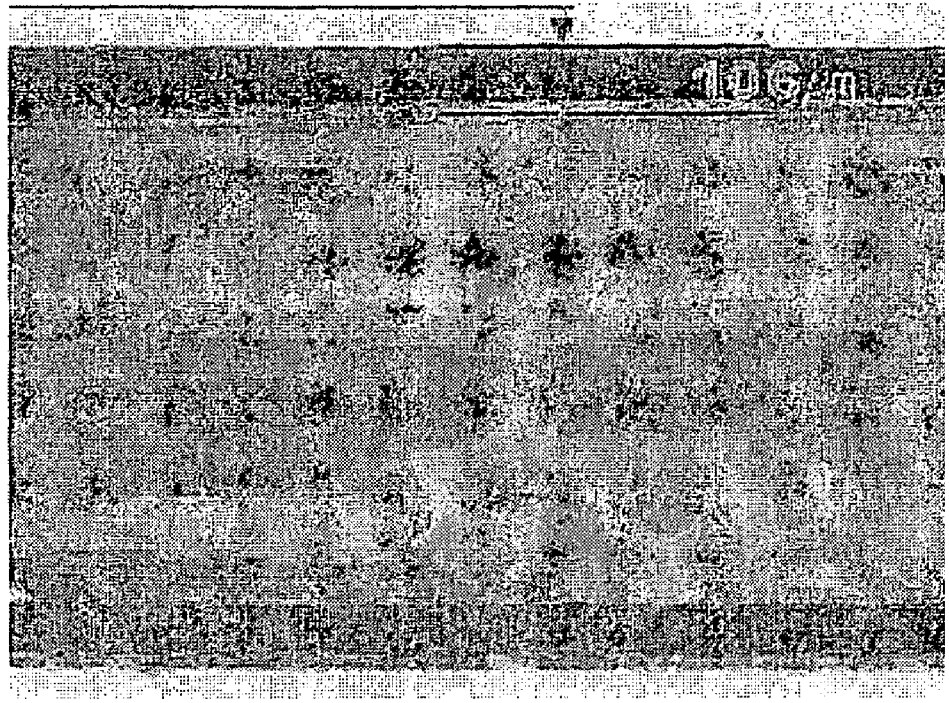
FIG. 2A is a scanning electron microscope (SEM) photo illustrating a cross-section of a transparent moisture absorption layer obtained in Example 1.

FIG. 2A is a scanning electron microscope (SEM) photo illustrating a cross-section of the transparent moisture absorption layer obtained in Example 1.

FIG. 2A confirms that the transparent moisture absorption layer was about 106 μm thick and had a level condition on its surface with the nano-sized metal oxide desiccant uniformly dispersed therein.

Figure 3:
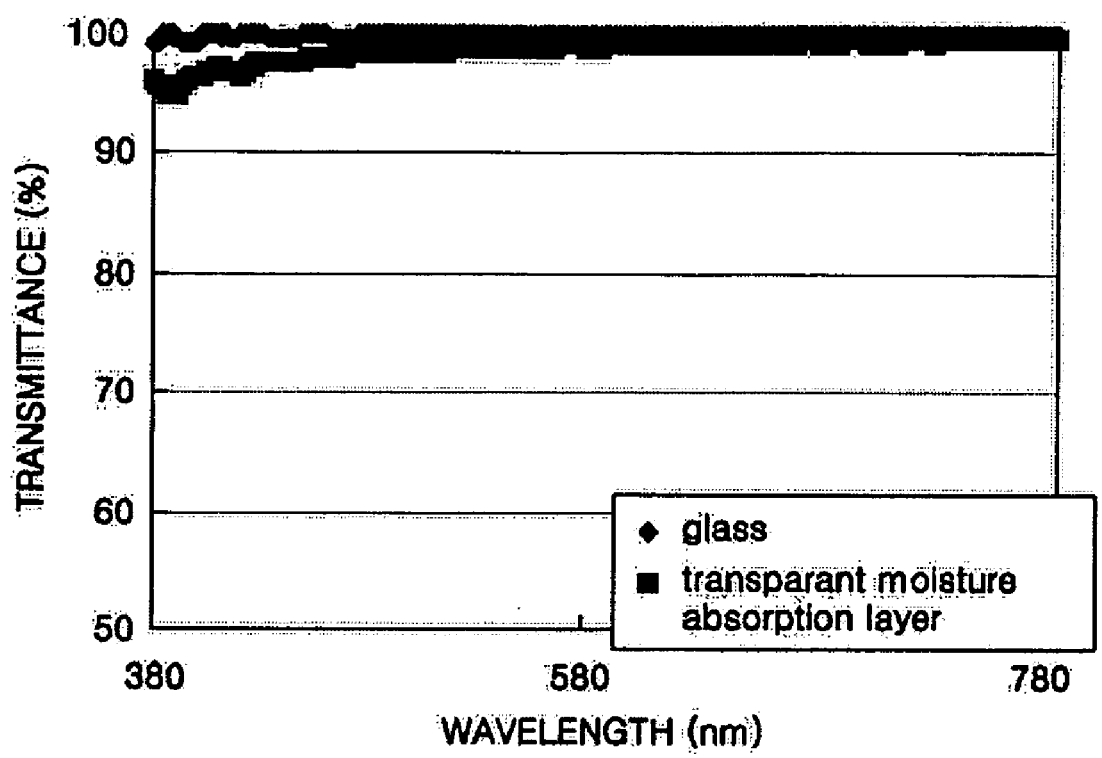
FIG. 3 illustrates the transmittance spectrum of the transparent moisture absorption layer obtained in Example 1.

FIG. 3 illustrates the transmittance spectrum of the transparent moisture absorption layer obtained in Example 1.

Referring to FIG. 3, the transmittance of the transparent moisture absorption layer was almost identical to the transmittance of glass over the entire visible light range, even though the transparent moisture absorption layer was thicker than about 100 μm.

EXAMPLE 2

An organic electroluminescent device was fabricated in the same manner as in Example 1, except that tetraethoxysilane was used instead of urethane acrylate.

EXAMPLE 3

An organic electroluminescent device was fabricated in the same manner as in Example 1, except that methacrylate polysiloxane was used instead of urethane acrylate.

EXAMPLE 4

An organic electroluminescent device was fabricated in the same manner as in Example 1, except that barium oxide (BaO) was used instead of anhydrous calcium oxide (CaO).

EXAMPLE 5

An organic electroluminescent device was fabricated in the same manner as in Example 3, except that phosphorouspentoxide ($P_2O_5$) was used instead of anhydrous calcium oxide (CaO).

COMPARATIVE EXAMPLE 1

An organic electroluminescent device was fabricated in the same manner as in Example 3, except that a transparent moisture absorption layer was not formed on a top surface of the soda glass substrate.

COMPARATIVE EXAMPLE 2

A conventional getter (Dynic HD-204) was formed on a soda glass substrate. The getter was also formed on at least a portion of a glass substrate having a first electrode, an organic layer, and a second electrode formed thereon. Then, the two substrates were combined to manufacture an organic electroluminescent device.

COMPARATIVE EXAMPLE 3

CaO particles (70 nm) having a primary particle diameter of about 0.1 μm or less were mixed with polyethylmethacrylate (PEMAS), as an organic binder, while stirring to obtain a solution. The solution was printed on an etched soda glass substrate and cured to form a moisture absorption layer.

An epoxy resin, as a sealant, was coated on at least a portion of the soda glass substrate having the moisture absorption layer formed thereon and at least a portion of a glass substrate having a first electrode, an organic layer, and a second electrode formed thereon. Then, the two substrates were combined to obtain an organic electroluminescent device.

In the organic electroluminescent device obtained in Comparative Example 3, the moisture absorption layer had a low transmittance of about 85% and a haze of 28.7, which indicates that the layer was opaque or translucent. Although the CaO particles had a primary particle diameter of 70 nm, they became aggregated due to electrostatic forces. Thus, the particles were not uniformly dispersed in the binder even when the particles were mixed with the binder.

The transmittances of the transparent moisture absorption layers obtained in Examples 1-5 were examined. The transmittances were 95% or greater which indicated that the layers were transparent and could be used in a front emission type device.

The moisture absorptions of the transparent moisture absorption layer obtained in Example 1 and the getter in Comparative Example 2 were measured. The results are shown in FIG. 4.

Figure 4:
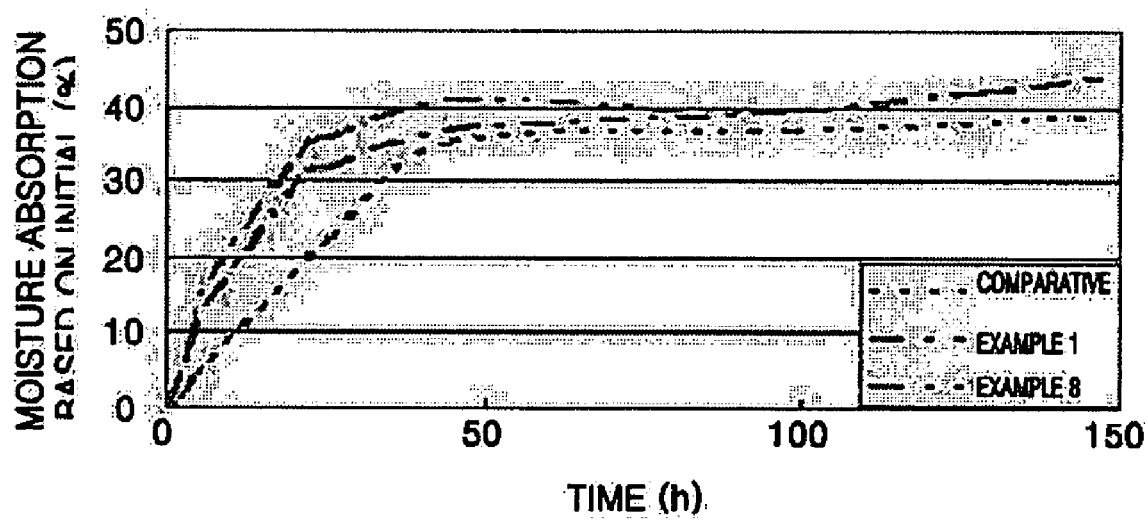
FIG. 4 is a graph of moisture absorptions of transparent moisture absorption layers obtained in Example 1, Example 8, and Comparative Example 5.

FIG. 4 confirms that the transparent moisture absorption layer obtained in Example 1 absorbed more moisture faster than the getter in Comparative Example 2.

The transparent moisture absorption layers obtained in Examples 2, 3, 4 and 5 had similar moisture absorption properties to the transparent moisture absorption layer obtained in Example 1; they were able to absorb more than 30 parts by weight of water based on 100 parts by weight of a total of the initial metal oxide in the transparent moisture absorption layer.

Figure 5A:
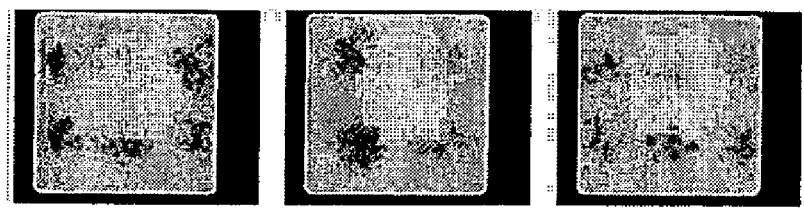
FIG. 5A shows images of organic electroluminescent devices obtained in Example 1, Comparative Example 1, and Comparative Example 2.
Figure 5A:
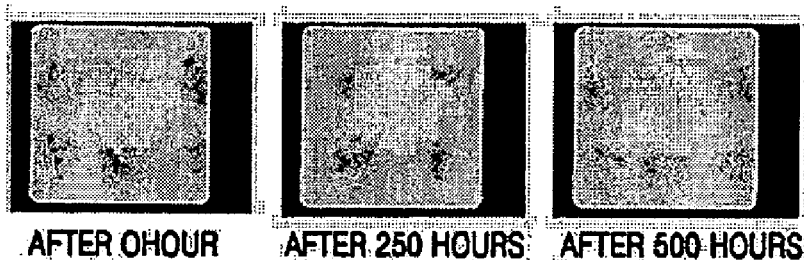
Figure 5A:
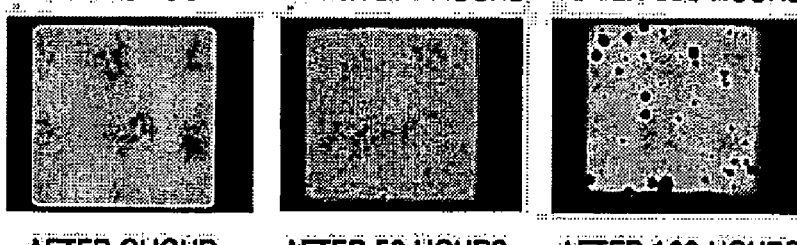

The organic electroluminescent devices obtained in Example 1, Comparative Example 1, and Comparative Example 2 were stored at 70° C. and 90% relative humidity and their images were observed using a microscope over time. The results are shown in FIG. 5A.

The organic electroluminescent devices obtained in Examples 1-5 and Comparative Examples 1 and 2 were stored at 70° C. and 90% relative humidity. Their brightnesses were observed over time under a microscope.

The brightnesses of the organic electroluminescent devices obtained in Examples 1-5 maintained 90% of the initial brightnesses after 500 hours in the accelerated conditions of 70° C. and 90% relative humidity (corresponding to real time of 20,000-30,000 hours), which were identical to or higher than the brightness of the organic electroluminescent device in which the conventional opaque desiccant was used (Comparative Example 2).

EXAMPLE 6

100 parts by weight of anhydrous calcium oxide (CaO) (average particle diameter of 30 μm) and 10 parts by weight of an organic/inorganic complex siloxane, epoxycyclohexyltrimethoxysilane as a dispersant, were mixed with 400 parts by weight of absolute ethanol. Then, the resulting mixture was milled for 24 hours to obtain a dispersion of particles with an average diameter of about 70 nm and a difference of about 80 nm between D10 and D90. The dispersion was mixed with 3000 parts by weight of urethane acrylate as an organic binder to obtain a composition for forming a transparent moisture absorption layer.

The composition was printed on an etched soda glass substrate and then thermally treated at 100° C. and UV cured to form a transparent moisture absorption layer.

An epoxy resin, as a sealant, was coated on at least a portion of the soda glass substrate with the transparent moisture absorption layer formed thereon and at least a portion of a glass substrate with a first electrode, an organic layer, and a second electrode formed thereon. Then, the two substrates were combined to form an organic electroluminescent device.

EXAMPLE 7

An organic electroluminescent device was fabricated in the same manner as in Example 6, except that the CaO particles had an average particle diameter of about 70 nm and a difference of about 60 nm between D10 and D90 in a dispersion obtained after the milling.

EXAMPLE 8

An organic electroluminescent device was fabricated in the same manner as in Example 6, except that the CaO particles had an average particle diameter of about 70 nm and a difference of about 70 nm between D10 and D90 in a dispersion obtained after the milling.

Figure 2B:
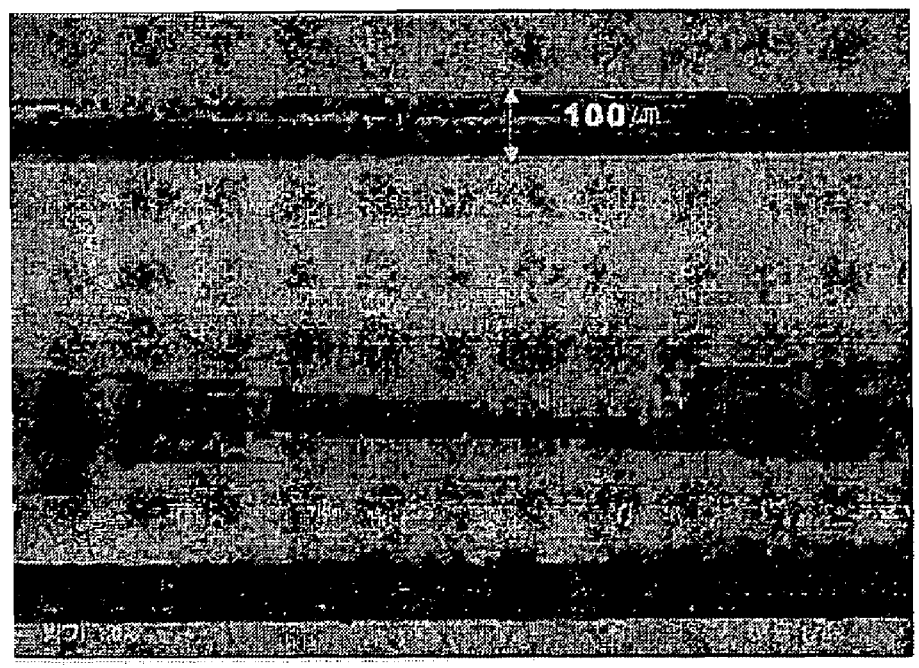
FIG. 2B is an SEM photo illustrating a cross-section of a transparent moisture absorption layer obtained in Example 6.

FIG. 2B is an SEM photo illustrating a cross-section of the transparent moisture absorption layer obtained in Example 6.

FIG. 2B confirms that the transparent moisture absorption layer was about 100 μm thick and had a level condition on its surface with the nano-sized metal oxide desiccant uniformly dispersed therein without being deposited.

Figure 6:
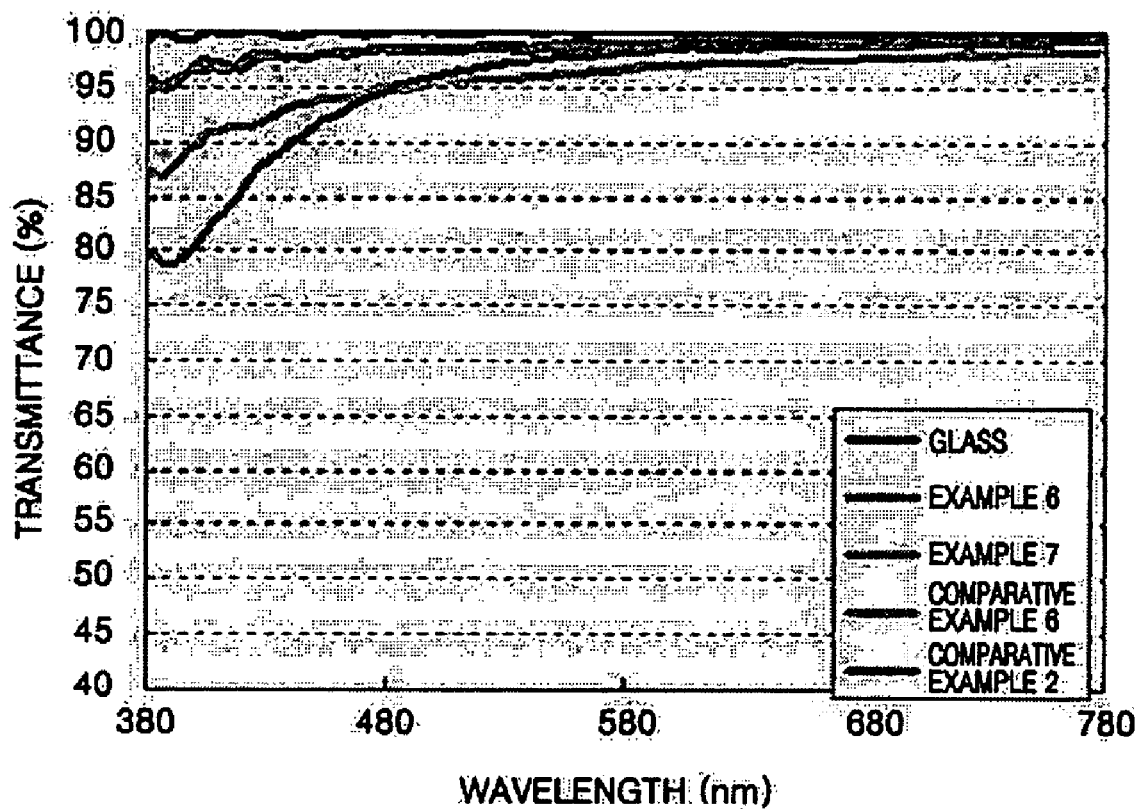
FIG. 6 illustrates transmittance spectrums of transparent moisture absorption layers obtained in Example 6, Example 7, Comparative Example 6 and Comparative Example 7.

FIG. 6 illustrates transmittance spectrums of the transparent moisture absorption layers obtained in Example 6, Example 7, Comparative Example 6, and Comparative Example 7.

Referring to FIG. 6, the transmittances of the transparent moisture absorption layers obtained in Example 6 and Example 7 were almost identical to the transmittance of glass over the entire visible light range, even though the transparent moisture absorption layers was more than about 100 μm thick.

EXAMPLE 9

An organic electroluminescent device was fabricated in the same manner as in Example 6, except that barium oxide (BaO) was used instead of anhydrous calcium oxide (CaO).

EXAMPLE 10

An organic electroluminescent device was fabricated in the same manner as in Example 6, except that phosphorouspentoxide ($P_2O_5$) was used instead of anhydrous calcium oxide (CaO).

COMPARATIVE EXAMPLE 4

An organic electroluminescent device was fabricated in the same manner as in Example 8, except that a transparent moisture absorption layer was not formed on a top surface of the soda glass substrate.

COMPARATIVE EXAMPLE 5

A conventional getter (Dynic HD-204) was formed on a soda glass substrate. The getter was also formed on at least a portion of a glass substrate having a first electrode, an organic layer, and a second electrode formed thereon. Then, the two substrates were combined to form an organic electroluminescent device.

COMPARATIVE EXAMPLE 6

An organic electroluminescent device was fabricated in the same manner as in Example 6, except that the anhydrous calcium oxide (CaO) particles had an average particle diameter of about 70 nm and a difference of about 150 nm between D10 and D90 in a dispersion obtained after the milling.

COMPARATIVE EXAMPLE 7

An organic electroluminescent device was fabricated in the same manner as in Example 1, except that the anhydrous calcium oxide (CaO) particles had an average particle diameter of about 70 nm and a difference of about 300 nm between D10 and D90 in a dispersion obtained after the milling.

The transmittance and haze of the organic electroluminescent devices obtained in Example 6, Example 7, Example 8, Comparative Example 6, and Comparative Example 7 are listed in Table 1.

TABLE 1

|  | Example 6 | Example 7 | Example 8 | Comparative Example 6 | Comparative Example 7 |
| --- | --- | --- | --- | --- | --- |
| Transmittance (%) | 95 | 96 | 95 | 87 | 78 |
| Haze | 0.6 | 0.3 | 0.5 | 2.0 | 12.5 |

Referring to Table 1, although the average particle diameters were identical in all of the samples a transparent layer having a haze of 1.0 or less was obtained when the difference between D10 and D90 was 100 nm or less (Example 6, Example 7, and Example 8), while a translucent layer having a haze of 1.0 or greater was obtained when the difference between D10 and D90 was 150 nm or greater (Comparative Example 6 and Comparative Example 7).

The transmittances of the transparent moisture absorption layers obtained in Example 6, Example 7, Example 8, and Example 9 were examined. The transmittances were 95% or greater, which indicated that the layers were transparent and could be used in a front emission type device.

The moisture absorptions of the transparent moisture absorption layer obtained in Example 8 and the getter in Comparative Example 5 were measured. The results are shown in FIG. 4.

FIG. 4 confirms that the transparent moisture absorption layer obtained in Example 8 absorbed more moisture faster than the getter in Comparative Example 5.

The transparent moisture absorption layers obtained in Example 6, Example 7, and Example 9 had similar moisture absorption properties to the transparent moisture absorption layer obtained in Example 8; they were able to absorb more than 30 parts by weight of water based on 100 parts by weight of a total of the initial metal oxide in the transparent moisture absorption layer.

Figure 5B:
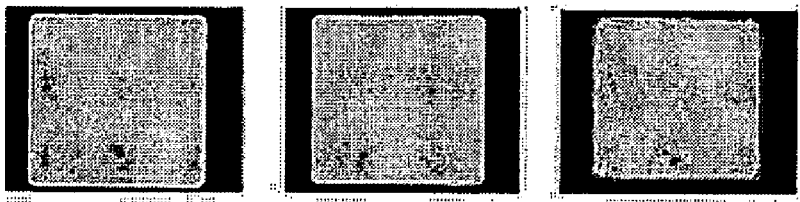
FIG. 5B illustrates lifetimes of organic electroluminescent devices obtained in Example 8 and Comparative Example 5.
Figure 5B:
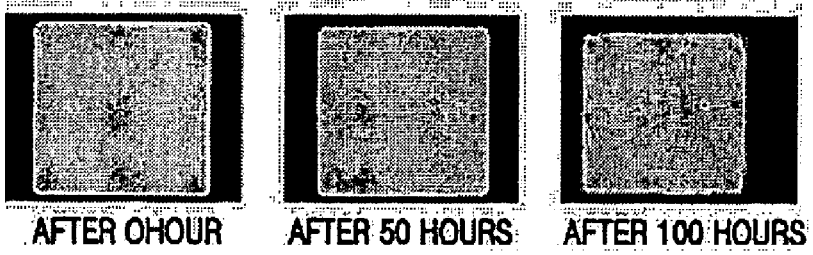

The organic electroluminescent devices obtained in Example 8 and Comparative Example 5 were stored at 70□ and 90% relative humidity. Their images were observed using a microscope over time. The results are shown in FIG. 5B.

The organic electroluminescent devices obtained in Example 6, Example 7, Example 8, Example 9, Comparative Example 4, and Comparative Example 5 were stored at 70° C. and 90% relative humidity and their brightness was observed over time.

The brightnesses of the organic electroluminescent devices obtained in Examples 6, Example 7, Example 8, and Example 9 maintained at 90% of their initial brightnesses after 500 hours in the accelerated conditions of 70□ and 90% relative humidity (corresponding to a real time of 20,000-30,000 hours), which were identical to or higher than the brightness of the organic electroluminescent device in which the conventional opaque desiccant was used (Comparative Example 5).

EXAMPLE 11

57 g of ethanol was mixed with 3 g of anhydrous CaO powder in a 250 mL airtight container in a glove box to prepare a composition for forming a transparent moisture absorption layer. Then, zirconia beads with a diameter of 0.3 mm that were previously dried at 250☐, were added to the composition and the container was sealed to prevent exposure to the outside atmosphere and installed in a paint shaker. Next, the contents in the container were milled for 18 hours.

Next, the beads were separated from the CaO dispersion in the glove box and the particle diameter in the dispersion was measured. The solid concentration of the CaO dispersion thus obtained was adjusted to about 15% by weight. 600 parts by weight of urethane acrylate as a binder, based on 100 parts by weight of the dispersion was mixed with the dispersion to obtain a composition for forming a transparent moisture absorption layer.

The obtained composition was printed on an etched glass substrate and then thermally treated at 100☐ and UV cured to form a transparent moisture absorption layer.

EXAMPLE 12

A composition for forming a transparent moisture absorption layer was prepared in the same manner as in Example 11, except that 51 g of ethanol, 3 g of anhydrous CaO powders, and 6 g of dimethylformamide were used.

EXAMPLE 13

A composition for forming a transparent moisture absorption layer was prepared in the same manner as in Example 11, except that methylcellosolve was used instead of dimethylformamide.

EXAMPLE 14

A composition for forming a transparent moisture absorption layer was prepared in the same manner as in Example 11, except that PGM was used instead of dimethylformamide.

EXAMPLE 15

A composition for forming a transparent moisture absorption layer was prepared in the same manner as in Example 11, except that butanol was used instead of ethanol.

EXAMPLE 16

A composition for forming a transparent moisture absorption layer was prepared in the same manner as in Example 11, except that 48 g of ethanol was used instead of 57 g of ethanol, and 9 g of an organic/inorganic complex silicon alkoxide, epoxycyclohexylsilane, was further added.

EXAMPLES 17 AND 18

Compositions for forming a transparent moisture absorption layer were prepared in the same manner as in Example 16, except that an organic/inorganic complex titanium alkoxide, titanium isopropoxide, and an organic/inorganic complex aluminum alkoxide, aluminum isopropoxide, were used instead of the organic/inorganic complex silicon alkoxide polymer, respectively.

EXAMPLE 19

36 g of a mixture of ethanol with methylcellosolve (weight ratio of 1:1) was mixed with 15 g of anhydrous CaO powder in a 250 mL airtight container in a glove box. Then 9 g of epoxycyclohexylsilane, an organic/inorganic complex silicone, was added to the mixture to prepare a composition for forming a transparent moisture absorption layer. Then, zirconia beads with a diameter of 0.3 mm that was previously dried at 250☐ were added to the composition and the container was sealed so that it would not be exposed to the outside atmosphere. The container was then installed in a paint shaker. Next, the contents of the container were milled for 18 hours.

Next, the beads were separated from the CaO dispersion in the glove box and the particle diameter in the dispersion was measured. The solid concentration of the CaO dispersion thus obtained was adjusted to about 15% by weight.

EXAMPLE 20

A composition for forming a transparent moisture absorption layer was prepared in the same manner as in Example 19, except that acetyl acetone was used instead of the organic/inorganic complex silicon alkoxide polymer.

EXAMPLE 21

A composition for forming a transparent moisture absorption layer was prepared in the same manner as in Example 19, except that an acrylic resin ($M_w$=8000-150000) (polyacrylate) was used instead of the organic/inorganic complex silicon alkoxide polymer.

EXAMPLE 22

A composition for forming a transparent moisture absorption layer was prepared in the same manner as in Example 19, except that an epoxy resin ($M_w$=8000-150000) (polyacrylate) was used instead of the organic/inorganic complex silicon alkoxide polymer.

Average particle diameters of the compositions obtained in Examples 11-20 were measured. The results are shown Table 2.

TABLE 2

| | Average particle diameter (nm) |
|---|---|
| Example 11 | 98.5 |
| Example 12 | 87.2 |
| Example 13 | 74.2 |
| Example 14 | 74.2 |
| Example 15 | 92.4 |
| Example 16 | 64.1 |
| Example 17 | 66.3 |
| Example 18 | 66.3 |
| Example 19 | 53.5 |
| Example 20 | 69.5 |
| Example 21 | 72.8 |
| Example 22 | 79.7 |

Figure 7:
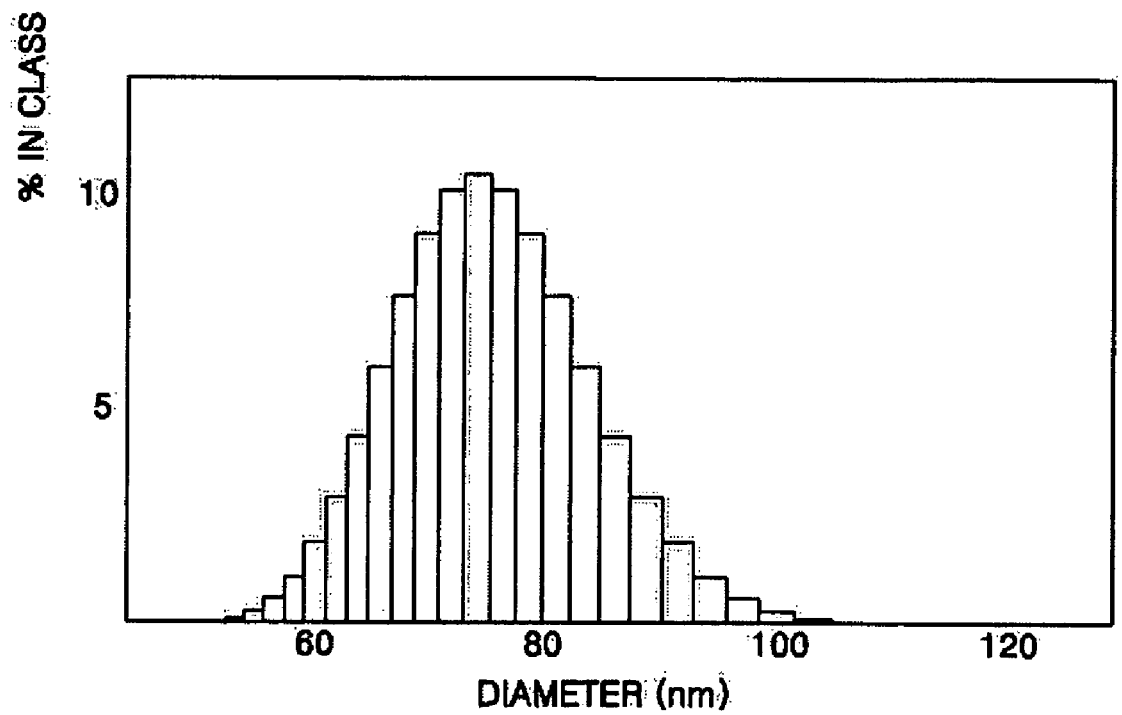
FIG. 7 and FIG. 8 are graphs of the particle size distributions of CaO in compositions for forming a transparent moisture absorption layer obtained in Example 14 and Example 20 according to exemplary embodiments of the present invention, respectively.
Figure 8:
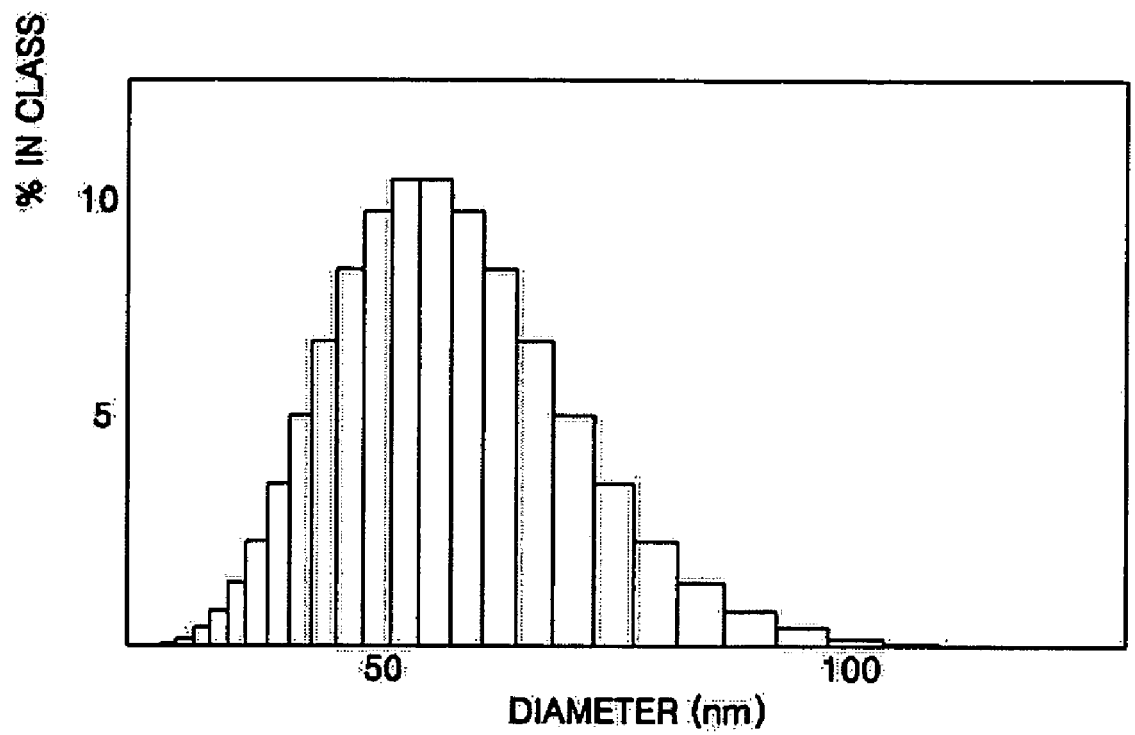

FIG. 7 and FIG. 8 are graphs of the particle size distribution of CaO in the compositions for forming a transparent moisture absorption layer obtained in Examples 14 and 20.

Referring to FIG. 7 and FIG. 8, it was confirmed that when the dispersant was used, the particle size decreased.

EXAMPLE 23

The composition obtained in Example 11 was printed on a soda glass substrate and then thermally treated at 150☐ to form a transparent moisture absorption layer.

An epoxy resin as a sealant was coated on at least a portion of the soda glass substrate having the transparent moisture absorption layer formed thereon and at least a portion of a glass substrate having a first electrode, an organic layer, and a second electrode formed thereon. Then, the two substrates were combined to obtain an organic electroluminescent device.

COMPARATIVE EXAMPLE 8

An organic electroluminescent device was fabricated in the same manner as in Example 11, except that a transparent moisture absorption layer was not formed on a top surface of the soda glass substrate.

COMPARATIVE EXAMPLE 9

A conventional getter (Dynic HD-204) was formed on a top surface of a soda glass substrate, and an epoxy resin was coated on at least a portion of the soda glass substrate and at least a portion of a glass substrate having a first electrode, an organic layer, and a second electrode formed thereon. Then, the two substrates were combined form an organic electroluminescent device.

The transmittance of the transparent moisture absorption layer obtained in Example 11 was examined. The transmittance was 95% or greater indicating that the layer was transparent and could be used in a front emission type device.

The moisture absorptions of the transparent moisture absorption layer obtained in Example 23 and the getter in Comparative Example 9 were measured. It was confirmed that the transparent moisture absorption layer obtained in Example 23 absorbed more moisture faster than the getter in Comparative Example 9.

The organic electroluminescent devices obtained in Example 23, Comparative Example 8, and Comparative Example 9 were stored at 70☐ and 90% relative humidity and their images were observed over time using a microscope.

It was confirmed that the organic electroluminescent device obtained in Example 2-3 had a longer lifespan than the organic electroluminescent devices obtained in Comparative Example 8 and Comparative Example 9.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic electroluminescent device, comprising:
    a substrate;
    an encapsulation substrate;
    an organic electroluminescent portion interposed between the substrate and the encapsulation substrate; and
    a transparent moisture absorption layer;
    wherein the transparent moisture absorption layer comprises:
    at least one of a metal oxide and a metal salt with an average particle diameter having a range of 50 nm to 90 nm;
    a binder; and
    a dispersant,
    wherein the binder comprises at least one selected from the group consisting of an organic binder and an organic/inorganic complex binder,
    wherein the organic binder includes at least one selected from the group consisting of an acrylic resin, a methacrylic resin, polyisoprene, a vinyl resin, an epoxy resin, a urethane resin, and a cellulose resin,
    wherein the organic/inorganic complex binder includes at least one selected from the group consisting of epoxy silane or its derivative, vinyl silane or its derivative, amine silane or its derivative, methacrylate silane or its derivative, and a partially cured product thereof,
    wherein at least one of the metal oxide and the metal salt has a difference of 100 nm or less between a particle diameter under which 10% by weight of the particles are to be found (D10) and a particle diameter under which 90% by weight of the particles are to be found (D90), and
    wherein the transparent moisture absorption layer has a transmittance of about 95% to about 98% at 380 nm to 780 nm and a moisture absorption of about 30% to about 50%.

2. The organic electroluminescent device of claim 1, wherein the transparent moisture absorption layer is formed on a sidewall of a sealant layer that couples the substrate to the encapsulation substrate, or on a portion of at least one of the substrate and the encapsulation substrate.

3. The organic electroluminescent device of claim 1, wherein the metal oxide and the metal salt are selected from the group consisting of an alkali metal oxide, an alkali earth metal oxide, a metal halide, a metal sulfate, and a metal perchlorate.

4. The organic electroluminescent device of claim 3, wherein the alkali metal oxide is lithium oxide ($Li_2O$), sodium oxide ($Na_2O$), or potassium oxide ($K_2O$),
wherein the alkali earth metal oxide is barium oxide (BaO), calcium oxide (CaO), or magnesium oxide (MgO),
wherein the metal sulfate is lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$), or nickel sulfate ($NiSO_4$),
wherein the metal halide is calcium chloride ($CaCl_2$), magnesium chloride ($MgCl_2$), strontium chloride ($SrCl_2$), yttrium chloride ($YCl_2$), copper chloride ($CuCl_2$), cesium fluoride (CsF), tantalum fluoride ($TaF_5$), niobium fluoride ($NbF_5$), lithium bromide (LiBr), calcium bromide ($CaBr_3$), cerium bromide ($CeBr_4$), selenium bromide ($SeBr_2$), vanadium bromide ($VBr_2$), magnesium bromide ($MgBr_2$), barium iodide ($BaI_2$), or magnesium iodide ($MgI_2$), and
wherein the metal perchlorate is barium perchlorate ($Ba(ClO_4)_2$) or magnesium perchlorate ($Mg(ClO_4)_2$).

5. The organic electroluminescent device of claim 1, wherein the metal oxide is anhydrous calcium oxide (CaO).

6. The organic electroluminescent device of claim 1, wherein the dispersant comprises at least one selected from the group consisting of a low molecular weight organic dispersant, a high molecular weight organic dispersant, a high molecular organic/inorganic complex dispersant, a low molecular organic/inorganic complex dispersant, and an organic acid.

7. The organic electroluminescent device of claim 1, wherein the concentration of the dispersant is about 1 part to about 100 parts by weight based on 100 parts by weight of the metal oxide and the metal salt.

8. The organic electroluminescent device of claim 1, wherein the concentration of the binder is about 10 parts to about 5000 parts by weight, based on 100 parts by weight of metal oxide and the metal salt.

9. The organic electroluminescent device of claim 1, wherein the average particle diameter of the metal oxide and the metal salt is about 50 to about 90 nm.

10. The organic electroluminescent device of claim 1, wherein the transparent moisture absorption layer is about 0.1 μm to about 300 μm thick.

11. The organic electroluminescent device of claim 1, wherein when the transparent moisture absorption layer is about 100 μm to about 300 μm thick, the transparent moisture absorption layer has a transmittance of about 96% to about 98% and a moisture absorption of about 30% to about 40%.

12. The organic electroluminescent device of claim 1, wherein the metal oxide and the metal salt have an average particle diameter of about 100nm or less.

13. The organic electroluminescent device of claim 1, wherein the metal oxide and the metal salt have a minimum particle diameter of about 30 nm or more and a maximum particle diameter of about 120 nm or less.

14. The organic electroluminescent device of claim 1, wherein the transparent moisture absorption layer has a transmittance of about 95% to about 98%, a moisture absorption of about 30% to about 50%, and a haze of about 0.2 to about 0.8.

15. An organic electroluminescent device, comprising:
a substrate;
an encapsulation substrate;
an organic electroluminescent portion interposed between the substrate and the encapsulation substrate;
a transparent moisture absorption layer; and
wherein the transparent moisture absorption layer comprises at least one of a metal oxide and a metal salt with an average particle diameter of about 100nm or less and a binder,
wherein the transparent moisture absorption layer is about 100 μm to about 300 μm thick,
wherein the transparent moisture absorption layer has a transmittance of about 95% or greater, and
wherein at least one of the metal oxide and the metal salt have a difference of 100 nm or less between a particle diameter under which 10% by weight of the particles are to be found (D10) and a particle diameter under which 90% by weight of the particles are to be found (D90).

16. The organic electroluminescent device of claim 15, wherein the transparent moisture absorption layer is formed on a sidewall of a sealant layer that couples the substrate to the encapsulation substrate, or on a portion of at least one of the substrate and the encapsulation substrate.

17. The organic electroluminescent device of claim 15, wherein the metal oxide and the metal salt are selected from the group consisting of an alkali metal oxide, an alkali earth metal oxide, a metal halide, a metal sulfate, and a metal perchlorate.

18. The organic electroluminescent device of claim 17, wherein the alkali metal oxide is lithium oxide ($Li_2O$), sodium oxide ($Na_2O$), or potassium oxide ($K_2O$),
wherein the alkali earth metal oxide is barium oxide (BaO), calcium oxide (CaO), or magnesium oxide (MgO),
wherein the metal sulfate is lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$), or nickel sulfate ($NiSO_4$),
wherein the metal halide is calcium chloride ($CaCl_2$), magnesium chloride ($MgCl_2$), strontium chloride ($SrCl_2$), yttrium chloride ($YCl_2$), copper chloride ($CuCl_2$), cesium fluoride (CsF), tantalum fluoride ($TaF_5$), niobium fluoride ($NbF_5$), lithium bromide (LiBr), calcium bromide ($CaBr_3$), cerium bromide ($CeBr_4$), selenium bromide ($SeBr_2$), vanadium bromide ($VBr_2$), magnesium bromide ($MgBr_2$), barium iodide ($BaI_2$), or magnesium iodide ($MgI_2$), and
wherein the metal perchlorate is barium perchlorate ($Ba(ClO_4)_2$) or magnesium perchlorate ($Mg(ClO_4)_2$).

19. The organic electroluminescent device of claim 17, wherein the metal oxide is anhydrous calcium oxide (CaO).

20. The organic electroluminescent device of claim 15, wherein the concentration of the binder in the transparent moisture absorption layer is about 10 parts to about 5000 parts by weight based on 100 parts by weight of the metal oxide and the metal salt.

21. The organic electroluminescent device of claim 15, wherein the binder includes at least one binder selected from the group consisting of an organic binder, an inorganic binder, and an organic/inorganic complex binder.

22. The organic electroluminescent device of claim 21, wherein the organic binder includes at least one selected from the group consisting of an acrylic resin, a methacrylic resin, polyisoprene, a vinyl resin, an epoxy resin, a urethane resin, and a cellulose resin.

23. The organic electroluminescent device of claim 21, wherein the inorganic binder includes at least one selected from the group consisting of titania, silicon oxides, zirconia, alumina, and a precursor thereof.

24. The organic electroluminescent device of claim 21, wherein the organic/inorganic complex binder includes at least one selected from the group consisting of epoxy silane or its derivative, vinyl silane or its derivative, amine silane or its derivative, methacrylate silane or its derivative, and a partially cured product thereof.

25. The organic electroluminescent device of claim 15, wherein the average particle diameter of the metal oxide and the metal salt is about 50 to about 90 nm.

26. The organic electroluminescent device of claim 15, wherein the transparent moisture absorption layer has a moisture absorption of about 30% to about 50% and a haze of about 0.2 to about 0.8.

* * * * *